United States Patent [19]

Prigge et al.

[11] Patent Number: 5,110,428
[45] Date of Patent: May 5, 1992

[54] PROCESS AND APPARATUS FOR DOUBLE-SIDED CHEMOMECHANICAL POLISHING OF SEMICONDUCTOR WAFERS AND SEMICONDUCTOR WAFERS OBTAINABLE THEREBY

[75] Inventors: Helene Prigge, Chatswood, Australia; Josef Lang, Burghausen, Fed. Rep. of Germany

[73] Assignee: Wacker-Chemitronic Gesellschaft fur Elektronik-Grundstoffe mbH, Burghausen, Fed. Rep. of Germany

[21] Appl. No.: 577,678

[22] Filed: Sep. 4, 1990

[30] Foreign Application Priority Data

Sep. 5, 1989 [DE] Fed. Rep. of Germany ....... 3929484

[51] Int. Cl.⁵ .................. C25F 3/30; C25F 7/00
[52] U.S. Cl. .................. 204/129.3; 204/129.43; 204/129.46; 204/217; 204/224 M; 156/657; 156/662
[58] Field of Search .............. 156/657, 662; 204/129.46, 129.3, 224 M, 212, 217

[56] References Cited

U.S. PATENT DOCUMENTS

| 2,965,556 | 12/1960 | Damgaard | 204/217 X |
| 3,073,764 | 1/1963 | Sullivan | 204/129.46 |
| 3,161,576 | 12/1964 | Teichner | 204/129.46 |
| 3,293,162 | 12/1966 | Sullivan | 204/129.46 X |
| 3,436,286 | 4/1969 | Lange | 156/662 X |
| 3,437,543 | 4/1969 | Winings | 156/662 X |
| 4,256,535 | 3/1981 | Banks | 156/662 X |
| 4,588,473 | 5/1986 | Hisatomi et al. | 156/662 X |

FOREIGN PATENT DOCUMENTS

| 1446067 | 1/1969 | Fed. Rep. of Germany | 204/129.46 |
| 7000964 | 1/1970 | Japan | 204/129.46 |
| 0808230 | 3/1981 | U.S.S.R. | 204/129.46 |

Primary Examiner—Donald R. Valentine
Attorney, Agent, or Firm—Collard, Roe & Galgano

[57] ABSTRACT

Semiconductor wafers, in particular, silicon wafers, with differently polished front and rear sides and high geometrical quality can be fabricated by double-sided polishing if the wafer surfaces are differently polarized during the polishing process. This can be achieved in a simple fashion, in that during polishing, an electric field is set up between the upper and lower polishing plates. This can be accomplished by providing the upper polishing plate between the plate surface and the polishing cloth with a thin conductive layer insulated with respect thereto, on which a voltage can be impressed, while both polishing plates are grounded to the frame.

9 Claims, 1 Drawing Sheet

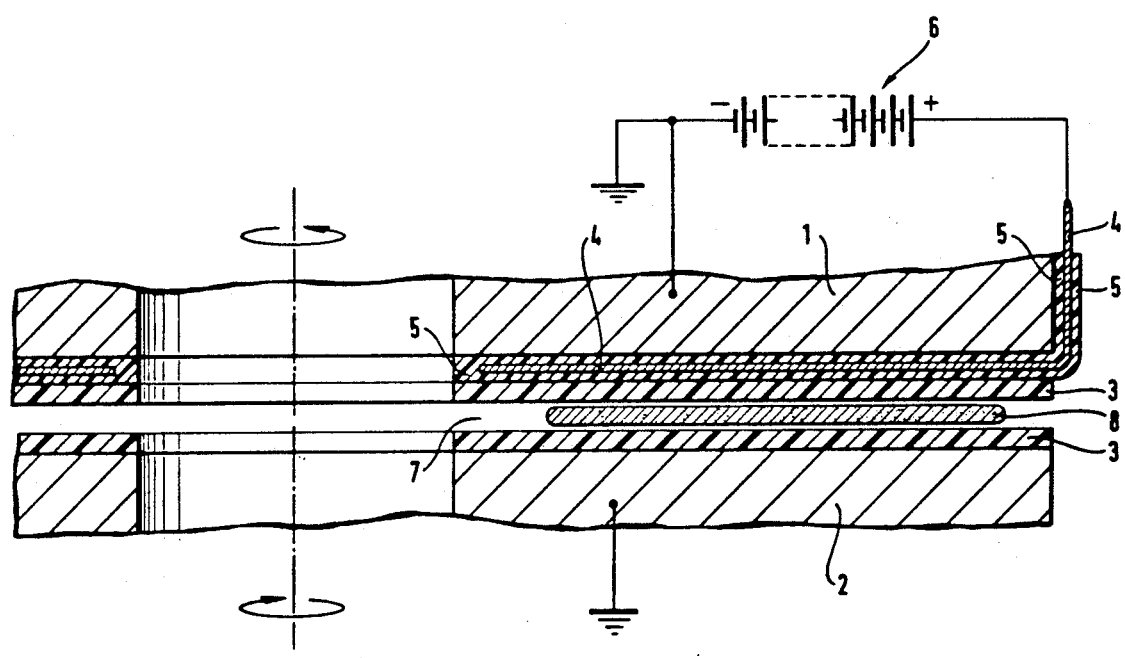

PROCESS AND APPARATUS FOR DOUBLE-SIDED CHEMOMECHANICAL POLISHING OF SEMICONDUCTOR WAFERS AND SEMICONDUCTOR WAFERS OBTAINABLE THEREBY

BACKGROUND OF THE INVENTION

The invention relates to a process and the double-sided chemo-mechanical polishing of semiconductor wafers, as well as to the semiconductor wafers obtainable thereby. More particularly, the invention relates to such a process and apparatus, and semiconductor wafers obtainable thereby, wherein the front and rear sides of the wafers are polished differently under the simultaneous action of an upper and a lower moving polishing surface, to which a polishing agent is applied.

Owing, above all, to the increasing demands on the flatness of wafers with large diameters, in the chemomechanical polishing of semiconductor wafers, double-sided polishing processes are gaining ever more in importance by comparison with the conventional single-sided polishing. In the case of double-sided polishing processes, the front and rear sides of the wafer are acted upon by simultaneously moving polishing surfaces that are configured in the known polishing machines as counter-rotating, flat polishing plates. These plates are covered with polishing cloths, to which a polishing agent is applied. In this process, the wafers are generally held in the openings of flat rotor disks, through which they experience an additional rotary movement between the upper and lower polishing plates. Double-sided polishing processes are described in the technical literature and known to the person skilled in the art; for example, technical machine aspects are described in the article by E. Mendel and J. R. Hause entitled "Multiple Wafer Free Polishing—Part I, Machine Concept," dated Apr. 10, 1980, which appeared as *IBM Technical Report TR* 22.2342, and technical process aspects of double-sided polishing are described in the article by E. Mendel and J. S. Basi entitled "Multiple Wafer Free Polishing—Part 2 Process," dated Apr. 10, 1980, which appeared as *IBM Technical Report TR* 22.2342.

The main advantage of the wafers obtained with the aid of the double-sided polishing process resides in their improved flatness by comparison with single-sided polished wafers. In this regard, the standard processes deliver wafers whose front and rear sides are polished in the same way and cannot be distinguished. In the fabrication of electronic components, however, the processes of most manufacturers are adapted to single-sided polished wafers, it often being the case that a further gettering damage, i.e., a surface layer that is subjected to a mechanical stress, e.g., provided with scratches, is required on the rear side. As a rule, such getter layers are applied before polishing. However, as a consequence of the strain arising during cementing, the surface of single-sided polished wafers has a certain waviness, which can be recognized, for example, with the so-called "Magic Mirror" (cf. in this connection, e.g., U.S. Pat. No. 4,547,073).

For these reasons, great interest attaches to a polishing process in which the advantages of double-sided polishing with respect to the excellent flatness can be combined with the product characteristics of single-sided polishing. In the above-mentioned article concerning the machine concept, the possibility of obtaining variously high abrasion rates and, thus, variously polished front and rear sides of the wafers, by the simultaneous use of various polishing cloths on the upper and lower polishing plates is noted. However, in the normal course of the polishing process, in which no direct contact occurs between the polishing cloth and the wafer, the differences thereby achievable between the two wafer surfaces are small. On the other hand, such a direct contact must be avoided, since it is extremely damaging for the course of the process, so that it is fundamentally scarcely possible for the result of the polishing process to be influenced in the case of this mode of procedure.

SUMMARY OF THE INVENTION

It is, therefore, an object of the invention to provide a novel process for the double-sided polishing of wafers whereby it is possible to obtain wafers of outstanding flatness with differently polished front and rear sides.

It is a further object of the present invention to provide apparatuses suitable for carrying out the process.

These and related objects are achieved according to the present invention by a process of the above-mentioned type wherein during the polishing process, which is carried out in a manner known per se, the front and rear sides of the wafers are differently polarized at least temporarily.

Surprisingly, it was found, in particular, that by means of such a polarization (which results, in the final analysis, to a negative or positive polarization of the bonds present in the surface region of the wafers to be polished), it is possible to influence and control the reactivity of the surface with respect to the polishing agent. For example, in the case of polishing agents that contain nucleophilic attacking components as effective substances, a negative polarization of the wafer surface effects an increase in the abrasion rate. On the other hand, a positive polarization of the wafer surface results in a decrease of the abrasion rate. For example, in the polishing of silicon wafers with alkaline polishing agents, the attack of the OH$^-$ions on the silicon is facilitated by negative polarization, and the abrasion rate is, thus, increased. Conversely, the abrasion rate is lowered by positive polarization. The reverse effect occurs in the case of a polishing process working via electrophilic agents.

The polarization of the front and rear sides of the wafers can be achieved in a particularly elegant way by setting up an electric field, at least temporarily, between the upper and lower polishing surfaces during the polishing process. For this purpose, it is advantageously possible, for example, in double-sided commercial polishing machines, additionally to provide between the plate surface and the polishing cloth covering it (in the case of at least one, preferably the upper, polishing plate) an electrically chargeable layer insulated with respect thereto, and to apply electrical charges thereon, for example, by impressing a voltage. In the case of this particularly simple embodiment, the opposing polishing plate is connected to the frame to ground it. It is equally possible to provide this polishing plate in an analogous way with an electrically chargeable layer that is insulated with respect to the plate surface and polishing cloth, and to impress a voltage thereon. However, as a rule, recourse need be made to this possibility only in cases in which particularly high electric field strengths are required.

Suitable as electrically chargeable layers are, for example, films of conductive plastics or, in particular, metal foils, for example, of steel, noble metals such as copper, silver or gold, or preferably aluminum. These layers can themselves be provided, for example, cemented, with an insulating coating, for example, films of water impervious and non-conductive plastics such as, for example, polyester, polyethylene, polypropylene, polyvinylchloride, or polytetrafluoroethylene. Another possibility consists in providing such insulating layers on the polishing plate surface and/or the rear side of the polishing cloth, and in inserting an uncoated or single-side coated metal foil when preparing the polishing plate for the polishing process. In order to guarantee a uniform structure of the electric field over the entire polishing surface that is effective during the polishing process, it is advantageous if this surface substantially coincides with the electrically chargeable layer. Of course, in selecting and applying the materials for the electrically chargeable layer and the insulating coating, it is necessary to ensure that no unevenness in the polishing surface is caused which impairs the polishing process.

In order to generate and maintain the electric field, the electrically chargeable layer is connected to a voltage source, preferably generated by a direct current source, that effects the influx of electrical charges, for example, batteries, accumulators, or generators in which, for example, charges are generated by friction or induction. Additionally, it is advantageous to provide control elements with the aid of which the strength of the electric field can be influenced and, as desired, increased or decreased during the polishing process or from polishing pass to polishing pass. Suitable for this are, for example, voltage regulators known from electrotechnology. It often happens that an electric field does not need to be impressed during the entire polishing process; in some instances, it is also sufficient if the field is impressed only temporarily, for example, if firstly a certain minimum abrasion on both sides of the wafer is to be achieved, before said sides are further polished differently. There is just as little need for the electric field to be held constant; it can, instead, be varied, for example, by reducing the field strength to diminish the differences in abrasion between the front and rear sides, or to increase said differences by increasing the field strength. Consequently, the process can be excellently matched to the particular product requirements.

As a rule, it has been proved sufficient if the voltage between the conductive layer connected to a voltage source and the opposing polishing plate, which is generally connected to the frame, to be 5 to 1000 volts. Preferably, a range of 5 to 100 volts and, in particular, 5 to 60 volts is employed, since voltages can be generated and applied in these ranges without great expense. However, these ranges are to be understood only in the sense of guide values, and not in the sense of a restriction. Fundamentally, the voltage can be increased up to the breakdown voltage, which is dependent, in each case, on the system and, for example, is influenced by the insulating layers provided. By contrast, if the voltage is reduced down to the other limiting value of 0 volts, the polishing process corresponds to the conventional double-sided polishing in which both sides of the wafers are polished in the same way.

In general, when selecting the voltage impressed in each case, it is also necessary for the technical safety regulations on which the operational use of electrical voltages is based to be observed. As a rule, the outlay on technical safety is higher the higher the voltage used, so that limits can arise herefrom for the outlay that is still economically acceptable. Furthermore, it is possible, e.g., in the case of some semiconductor materials such as silicon, for the effect of the anodization of the positively polarized side of the wafer, in the case of which the oxide formation stops the abrasion, to represent for the voltage a possible limiting factor that is essentially determined by the polishing cloth and the insulating layers.

The process is suitable for use in the double-sided polishing of elemental and compound semiconductor wafers, such as, for example, of silicon, germanium, indium phosphide or gallium arsenide. It is used with particular advantage in the case of silicon wafers with diameters of more than approximately 10 cm, on which particularly rigorous geometrical demands are placed. An advantage of the process is that the process parameters such as pressure, temperature, rotational speed and the like, and the polishing aids such as polishing cloths, polishing agents and the like, used in the known polishing processes, which are adapted in each case to the semiconductor material to be polished, do not need to be altered. Thus, silicon wafers, for example, of the known type, can be subjected to double-sided polishing in the presence of an alkaline polishing agent, to which, as a rule, a silicic acid sol has been added.

Experience has shown that the best results, in particular, in the case of silicon wafers, are obtained if the electric field is polarized such that the positive charge is adjacent to that wafer surface which is to be more strongly abraded during the polishing process. This observation supports the supposition that in the case of the popular semi conductor materials and, in particular, in the case of silicon, the polishing processes take place in the way that a chemically effective component of the polishing agent, which component acts as a nucleophile, (e.g., hydroxyliones) attacks the surface atoms of the wafers (e.g., the silicon atoms) and causes them to be stripped from the lattice array.

Other objects and features of the present invention will become apparent from the following detailed description considered in connection with the accompanying drawing which discloses one embodiment of the present invention. It should be understood, however, that the drawing is designed for the purpose of illustration only and not as a definition of the limits of the invention.

BRIEF DESCRIPTION OF THE DRAWING

The drawing is a fragmentarily illustrated, partially diagrammatic sectional view of a double-sided polishing machine suitable for carrying out the process according to the invention.

DETAILED DESCRIPTION OF THE PREFERRED EMBODIMENT

Turning now in detail to the drawing, therein illustrated are the conventional components of an arrangement for double-sided polishing, namely, an upper polishing plate 1 and a lower polishing plate 2. The flat, mutually facing inner surfaces of the plates are each covered with a polishing cloth 3, for example, of polyester or polyurethane. Additionally located between the plate surface of upper polishing plate 1 and the stretched polishing cloth 3 is a thin conductive layer 4, e.g., a metal foil, for example, of aluminum. It has been found advantageous for purposes of handling and manipulation, as well as ease of obtaining, to use foils having a thickness in the range of approximately 0.1 to 5 mm. This foil is insulated by insulating layers 5 both against the plate surface and against the polishing cloth, so that no current flow can occur, provided that the breakdown voltage is not exceeded. The metal foil is connected via appropriate, advantageously interruptible contacts, e.g., terminals or plugs, to a voltage source 6, for example, an accumulator, while both the upper and the lower polishing plate are connected, i.e., grounded, to a frame. If, now, by closing the contact to the positive pole of the voltage source, the metal foil is charged with positive charges, correspondingly negative charges simultaneously flow to the lower polishing plate 2, and an electric field is set up in the gap 7 between the upper and lower polishing plates. If, during the polishing process, a semiconductor wafer 8, e.g., of silicon, is located in this field, it becomes negatively polarized on its surface facing the upper polishing plate and positively polarized on the surface facing the lower polishing plate. The result of this is, finally, the different reactivity of the front and rear sides of the wafers with respect to the, for example, alkaline polishing agent, applied during the polishing. For reasons of clarity, the rotor disks usually surrounding the wafers in the case of double-sided polishing are not shown.

The polishing process, as such can be carried out under the known and usual conditions, and requires no further modifications.

The semiconductor wafers obtained have the excellent flatness that is achievable by means only of double-sided polishing (as opposed to single-sided polishing) while, at the same time, they have differently polished (e.g., polished to different degrees) front and rear sides. To date, this has not been obtainable in the case of double-sided polishing processes, even with the use of various polishing cloths, since the required abrasion differences could not be achieved with this method. Consequently, for wafers having very different front and rear sides, for example, having a smoothly polished front side and a roughened, gettered rear side, it was necessary to have recourse to single-sided treatment of the wafer surfaces, and in so doing, to accept the resultant inferior flatness. The flatness can, for example, be measured by the value of the total thickness variation (TTV). In order to measure the TTV value, a determination is made, for example, by means of capacitive or optical measuring methods, from a multiplicity of point measurements of the absolute value of the difference between the maximum and minimum thickness value of a wafer, the reference plane being provided by a plane parallel to the rear side of the wafer when the wafer is located on the flat vacuum sample holder in the vacuum-clamped state. Maximum values of approximately 5 $\mu$m result as typical TTV values, for example, in the case of single-sided polishing, for 100 percent of the silicon wafers obtained having diameters of approximately 10 to 20 cm, while maximum values of approximately 1.5 $\mu$m result for double-sided polished wafers of the same magnitude. It is possible by means of the process according to the invention to obtain wafers of such excellent flatness, but in the case of which the rear side of the wafer still, for example, has gettering microroughness or damage, and yet is, at the same time, polished and, therefore, has a low peak-to-valley height. In the fabrication of electronic components, such characteristics are increasingly being demanded for the wafers employed.

The invention is explained in more detail below, with reference to the following illustrative embodiments:

EXAMPLE 1

The upper polishing plate of a commercial arrangement for double-sided polishing having counter-rotating polishing plates covered by polishing cloths based on polyurethane was converted for carrying out the process according to the invention. For this purpose, an aluminum foil (layer thickness approximately 0.2 mm) pasted over on both sides with an insulating layer approximately 0.1 mm thick of polyester was inserted between the plate surface and the polishing cloth, the surface of which aluminum foil essentially corresponded to the surface of the polishing cloth effective during the polishing process. The aluminum foil was connected via terminal contacts to the positive terminal of a voltage source consisting of batteries connected in series and could thereby be positively charged. It was possible for the voltage to be regulated in steps between 0 and 100 volts through the number of the batteries connected in each case. Both polishing plates were grounded to a frame, so that when a voltage was impressed on the aluminum foil, electric fields could be set up in the gap between the polishing plates.

For the polishing process, a charge of 25 silicon wafers (diameter approximately 100 mm, thickness approximately 450 $\mu$m, (100)-orientation), which were alkaline-etched and, therefore, displayed an evident roughness on both surfaces, which was recognizable even with the unaided eye, was provided.

The wafers were firstly inserted in the usual way into the openings of the rotor disks laid on the lower polishing plate, and then the upper polishing plate was moved downwards into the operating position. The polishing process was now begun with the supply of an aqueous, alkaline polishing solution containing an $SiO_2$ sol. The temperature was set at approximately 40° C., the pressure was approximately 50 kPa. A voltage of 54 volts was impressed on the foil from the start of the polishing process onwards. The wafers were polished for approximately 20 minutes under these conditions, and thereafter the polishing process was terminated. The upper polishing plate was once again moved up into the initial position, and the wafers could be removed, freed from polishing residues and finally dried.

In order to determine the abrasion of the front and rear sides, and to determine the flatness, the wafers were now measured with the aid of a commercial measuring instrument using an optical measuring method. In this process, the wafer surfaces were tested by comparison with a reference surface. On the side of the wafer facing the upper polishing plate, the front side of the wafer, there was an abrasion of approximately 15-16 $\mu$m This side also proved to be completely polished, and upon visual inspection no longer displayed any residual roughness. By contrast, the abrasion on the opposing side of the wafer, the rear side, was only approximately 4-5 $\mu$m. Even with the unaided eye, there was still an evident residual roughness to be seen on this side. The flatness of the wafers proved to be excellent; thus, the maximum value for the total thickness variation (TTV) was approximately 1.5 $\mu$m.

Subsequently, 25 further silicon wafers of the same specification were polished in a check test in the same arrangement, and under the same conditions, for a period of 30 minutes, although no voltage was impressed on the metal foil.

The subsequent testing and measurement of the wafers obtained showed that both surfaces had been completely polished and could not be distinguished. Abrasion for the front and rear sides of the wafers was approximately 15 μm, the maximum value for the total thickness variation (TTV) approximately 1.5 μm.

The lower polishing plate was covered for the purpose of a further check test with a non-abrading type of polishing cloth, which had not delivered any abrasion in the case of single-sided polishing. Subsequently, a further polishing pass was carried out under conditions that were otherwise the same, without impressing an electric field; the period was 45 minutes.

The front side of the wafers was completely polished in the case of wafers obtained, the abrasion likewise being once again approximately 15 μm. Approximately 13 μm was abraded from the rear side, inspection with the unaided eye likewise revealing this surface as completely polished. However, in the collimated light of the haze lamp, it was possible to recognize the light scatter typical for slight residual roughness. The maximum value for the total thickness variation (TTV) was 3 μm.

EXAMPLE 2

Further polishing passes were carried out with wafers of the same specification in the same arrangement, with the impression of voltages of lesser or greater intensity.

In the first polishing pass, the voltage was set at 9 volt, and the period was 34 minutes. In the case of the silicon wafers removed thereafter and tested analogously, the abrasion was 13-14 μm on the front side and 6-7 μm on the rear side. The front sides of the wafers were completely polished, while it was still possible, with the unaided eye, to recognize a slight residual roughness on the rear side. The maximum value for the total thickness variation (TTV) was once again approximately 15. μm.

The voltage was raised to the value of 100 volt for a further polishing pass. After a polishing time of 28 minutes, it was possible to remove wafers which had been abraded by 16-17 μm on the front side and 3-4 μm on the rear side. Upon visual checking, the front side proved to be mirror smooth and, thus, completely polished, while the remaining residual roughness was well in evidence on the rear side. The maximum value of the total thickness variation (TTV) was 1.5 μm.

While only several examples and comparison examples of the present invention have been shown and described, it is to be understood that many changes and modifications may be made thereunto, without departing from the spirit and scope of the present invention as defined in the appended claims.

What is claimed is:

1. A process for the double-sided chemo-mechanical polishing of semiconductor wafers, comprising the steps of:
   simultaneously polishing the front and rear side of said wafers via upper and lower polishing surfaces, to which an alkaline polishing agent is applied;
   differently polarizing said front and rear surfaces of said wafers, at least temporarily, during said polishing step; and
   wherein said different polarizing step comprises establishing, at least temporarily, an electric field between said upper and lower polishing surfaces generated by a direct current source.

2. A process for the double-sided chemo-mechanical polishing of semiconductor wafers, comprising the steps of:
   simultaneously polishing the front and rear side of said wafers via upper and lower polishing surfaces, to which a polishing agent is applied;
   differently polarizing said front and rear surfaces of said wafers, at least temporarily, during said polishing step; and
   wherein said differently polarizing step comprises establishing, at least temporarily, an electric field between said upper and lower polishing surfaces generated by a direct current source.

3. The process according to claim 2, wherein said electric field is established by impressing a voltage of 5 to 100 volts between said upper and lower polishing surfaces.

4. The process according to claim 2, wherein said semiconductor wafers are silicon wafers.

5. A process for the double-sided chemo-mechanical polishing of semiconductor wafers, comprising the steps of:
   simultaneously polishing the front and rear side of said wafers via upper and lower polishing surfaces, to which a polishing agent is applied;
   differently polarizing said front and rear surfaces of said wafers, at least temporarily, during said polishing step;
   wherein said differently polarizing step comprises establishing, at least temporarily, an electric field between said upper and lower polishing surfaces; and
   wherein said electric field is polarized such that the positive charge is adjacent to the wafer surface to be more strongly abraded.

6. Apparatus for the double-sided chemo-mechanical polishing of semiconductor wafers comprising:
   an upper and a lower polishing plate;
   a polishing cloth covering a surface of each of said plates;
   an electrically chargeable layer provided for at least one of said polishing plates disposed between said plate surface thereof and said polishing cloth in an insulated manner with respect thereto; and
   at least one direct current voltage source connected to said electrically chargeable layer for generating an electric field between said upper and lower polishing plates.

7. The apparatus according to claim 6, wherein the other of said polishing plates, which opposes said at least one polishing plate provided with an insulated, electrically chargeable layer, is grounded.

8. A semiconductor wafer obtained by a process for the double-sided chemo-mechanical polishing of semiconductor wafers, comprising the steps of:
   simultaneously polishing the front and rear side of said wafers via upper and lower polishing surfaces, to which an alkaline polishing agent is applied;
   differently polarizing said front and rear surfaces of said wafers, at least temporarily, during said polishing step; and
   wherein said different polarizing step comprises established, at least temporarily, and electric field between said upper and lower polishing surfaces generated by a direct current source.

9. A semiconductor wafer obtained by a process for the double-sided chemo-mechanical polishing of semiconductor wafers, comprising the steps of:

simultaneously polishing the front and rear side of said wafers via upper and lower polishing surfaces, to which a polishing agent is applied;

differently polarizing said front and rear surfaces of said wafers, at least temporarily, during said polishing step;

wherein said differently polarizing step comprises establishing, at least temporarily, an electric field between said upper and lower polishing surfaces; and wherein said electric field is polarized such that the positive charge is adjacent to the wafer surface to be more strongly abraded.

* * * * *